(12) United States Patent
Su et al.

(10) Patent No.: US 6,828,198 B2
(45) Date of Patent: Dec. 7, 2004

(54) SYSTEM-ON-CHIP (SOC) SOLUTIONS WITH MULTIPLE DEVICES BY MULTIPLE POLY GATE TRIMMING PROCESS

(75) Inventors: Hung-Der Su, Kao-Hsiung Country (TW); Shien-Yang Wu, Hsin chu (TW); Yung-Shun Chen, Hsin-chu (TW); Tung-Heng Shie, Hsinchu (TW); Yuan-Hung Chiu, Taipei (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 89 days.

(21) Appl. No.: 10/392,120

(22) Filed: Mar. 19, 2003

(65) Prior Publication Data

US 2004/0185623 A1 Sep. 23, 2004

(51) Int. Cl.$^7$ ............................................. H01L 21/336
(52) U.S. Cl. ..................... 438/283; 438/294; 438/295; 438/296; 438/297; 438/195; 438/129; 438/666
(58) Field of Search ........................... 438/195, 283, 438/207, 219, 129, 666, 294, 295, 296, 297

(56) References Cited

U.S. PATENT DOCUMENTS

| | | | |
|---|---|---|---|
| 5,834,817 A | 11/1998 | Satoh et al. | 257/387 |
| 6,013,570 A | 1/2000 | Yu et al. | 438/595 |
| 6,110,785 A | 8/2000 | Spikes, Jr. et al. | 438/299 |
| 6,191,044 B1 | 2/2001 | Yu et al. | 438/713 |
| 6,383,847 B1 * | 5/2002 | Ditlow et al. | 438/128 |

* cited by examiner

*Primary Examiner*—Matthew Smith
*Assistant Examiner*—B V. Keshavan

(57) ABSTRACT

A method of forming gate electrode layer portions having differing widths comprising the following steps. A structure having a gate electrode layer and a hard mask layer thereover and including two or more active areas is provided. The hard mask layer is patterned to form two or more respective hard mask layer portions within the two or more active areas. One or more of the two or more respective hard mask layer portions is/are selectively trimmed to reduce its/their width to a second width leaving at least one the respective hard mask layer portions untrimmed. The gate electrode layer is then patterned.

43 Claims, 5 Drawing Sheets

SYSTEM-ON-CHIP (SOC) SOLUTIONS WITH MULTIPLE DEVICES BY MULTIPLE POLY GATE TRIMMING PROCESS

FIELD OF THE INVENTION

The present invention relates generally to semiconductor fabrication and more specifically to formation of devices having different channel lengths/critical dimension (CD) bias.

BACKGROUND OF THE INVENTION

Applying different logic operations in different patterns is the current approach for system-on-chip (SOC) applications to achieve different poly critical dimension (CD) biases between after-etch inspection (AEI) CD and drawing CD (the layout dimension) within the wafer which are required for multiple devices to achieve both high performance and low leakage devices within the wafer.

U.S. Pat. No. 6,191,044 B1 to Yu et al. describes hard mask trimming.

U.S. Pat. No. 6,013,570 to Yu et al. describes a gate trim process.

U.S. Pat. No. 5,834,817 to Satoh et al. describes another gate trim process.

U.S. Pat. No. 6,110,785 to Spikes, Jr. et al. describes a gate trim etch process.

SUMMARY OF THE INVENTION

Accordingly, it is an object of one or more embodiments of the present invention to provide a method of achieving different critical dimension (CD) bias within a wafer for SOC application.

Other objects will appear hereinafter.

It has now been discovered that the above and other objects of the present invention may be accomplished in the following manner. Specifically, a structure having a gate electrode layer and a hard mask layer thereover and including two or more active areas is provided. The hard mask layer is patterned to form two or more respective hard mask layer portions within the two or more active areas. One or more of the two or more respective hard mask layer portions is/are selectively trimmed to reduce its/their width to a second width leaving at least one the respective hard mask layer portions untrimmed. The gate electrode layer is then patterned.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
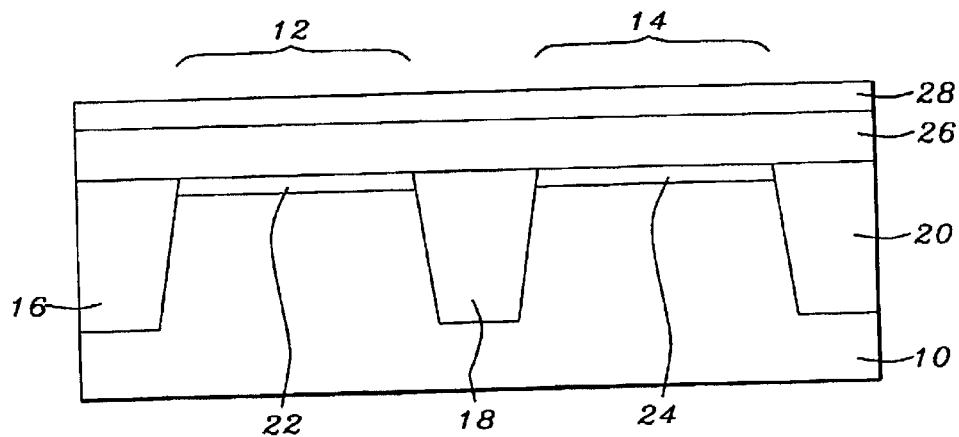
FIGS. 1 to 9 schematically illustrates a preferred embodiment of the present invention.

Initial Structure—FIG. 1

As shown in FIG. 1, structure 10 includes two or more active areas 12, 14 separated by isolation structures 16, 18, 20.

Structure 10 is preferably a silicon or germanium substrate, is more preferably a silicon substrate and is understood to possibly include a semiconductor wafer or substrate.

Isolation structures 16, 18, 20 are preferably shallow trench isolation (STI) structures or local-oxidation-of-silicon (LOCOS) and are more preferably STI structures, as will be used hereafter for purposes of illustration, comprised of silicon oxide.

Gate dielectric portions 22, 24 are formed over structure 10 within each of the two or more active areas 12, 14. Gate dielectric portions 22, 24 each have a thickness of preferably from about 3 to 300 Å and are preferably comprised of silicon oxide or germanium oxide and are more preferably silicon oxide as will be used for illustrative purposes hereafter.

A gate electrode layer 26 is then formed over the gate oxide portions 22, 24 and the STI's 16, 18, 20 to a thickness of preferably from about 500 to 3000 Å. Gate electrode layer 26 is preferably comprised of polysilicon (poly).

A hard mask layer 28 is then formed over the gate electrode layer 26 to a thickness of preferably from about 50 to 1000 Å. Hard mask layer 28 is preferably comprised of silicon nitride ($Si_3N_4$), silicon oxynitride (SiON) or silicon oxide ($SiO_2$).

Figure 2:
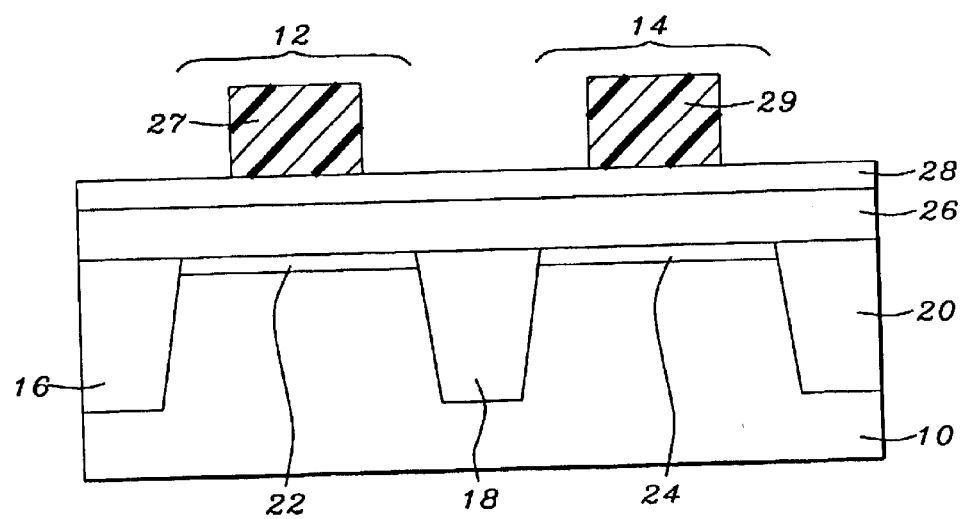

Formation of Patterned First Masking Layer Portions 27, 29—FIG. 2

As shown in FIG. 2, respective patterned first masking layer portions 27, 29 are formed over the hard mask layer 28 within each respective two or more active areas 12, 14 roughly between the STI's 16, 18, 20 separating the two or more active areas 12, 14.

As shown in the FIG. 2, patterned first masking layer portions 27, 29 are preferably comprised of photoresist (PR).

Figure 3:
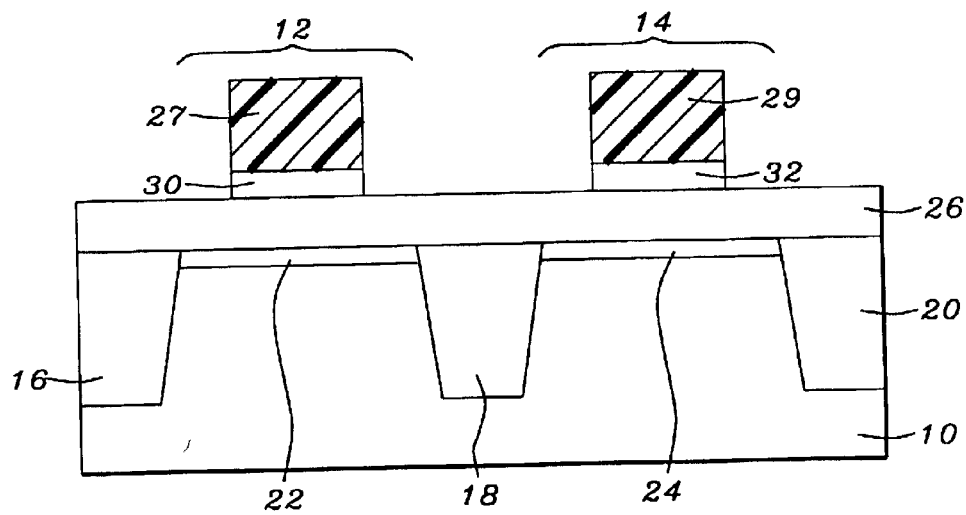

Patterning of Hard Mask Layer 28—FIG. 3

As shown in FIG. 3, hard mask layer 28 is patterned using the overlying patterned PR layer portions 27, 29 as masks to form respective hard mask layer portions 30, 32 overlying the gate electrode layer 26 within each respective two or more active areas 12, 14.

Each hard mask layer portion 30, 32 have a width of preferably from about 300 to 100,000 Å.

Figure 4:
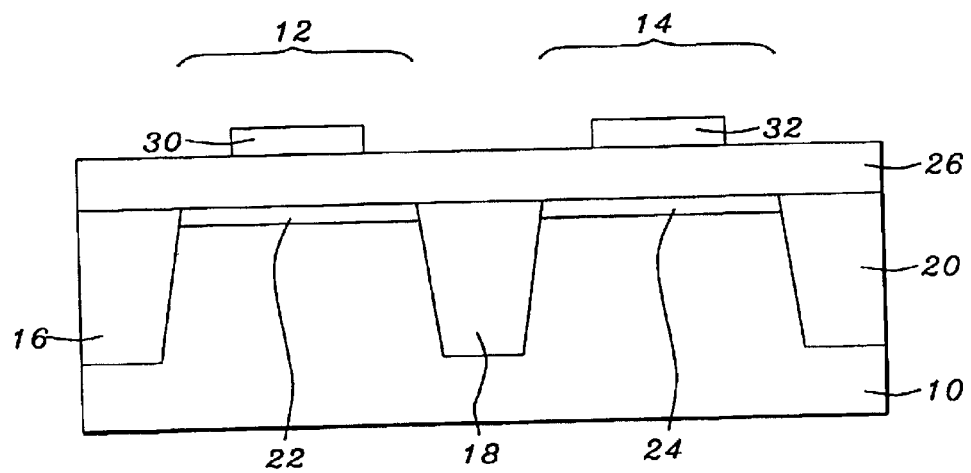

Removal of Patterned First PR Portions 27, 29—FIG. 4

As shown in FIG. 4, the patterned first PR portions 27, 29 are removed from over the hard mask layer portion 30, 32 and the structure is cleaned as necessary.

Figure 5:
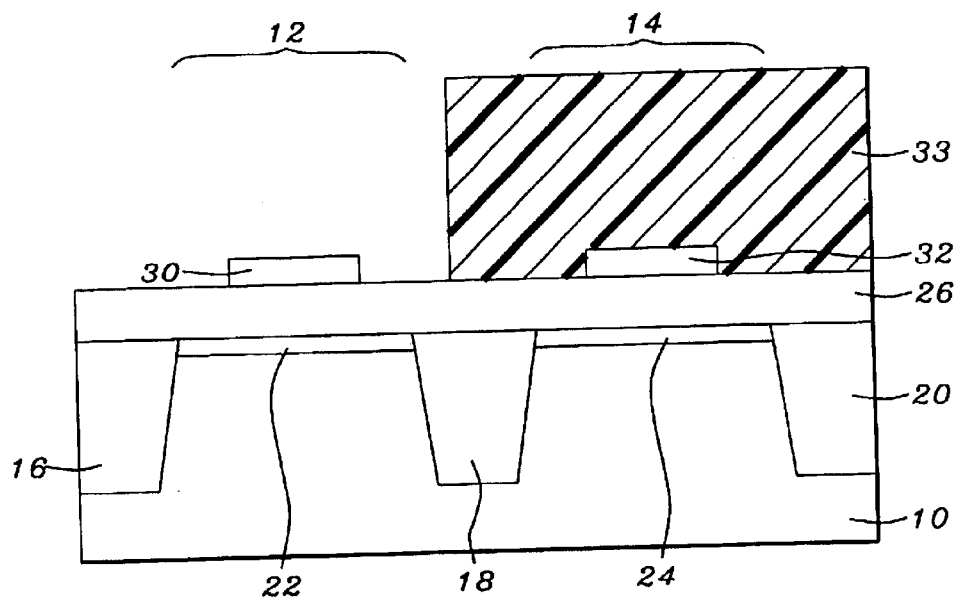

Formation of Patterned Second Masking Layer Portion 33—FIG. 5

As shown in FIG. 5, a patterned second masking layer portion 33 is formed at least over active area 14 containing the at least one hard mask layer portion 32 determined to eventually form a gate electrode with the wider/widest channel length(s), leaving exposed the hard mask layer portion 30 determined to eventually form a gate electrode with the smaller/smallest channel length.

It is noted that if three or more respective hard mask layer portions 30, 32 are formed within three or more respective active areas 12, 14, then one or more second masking layer portion(s) 33 is/are formed over at least the active areas containing the respective hard mask layer portions determined to not have the smallest channel length.

Figure 6:
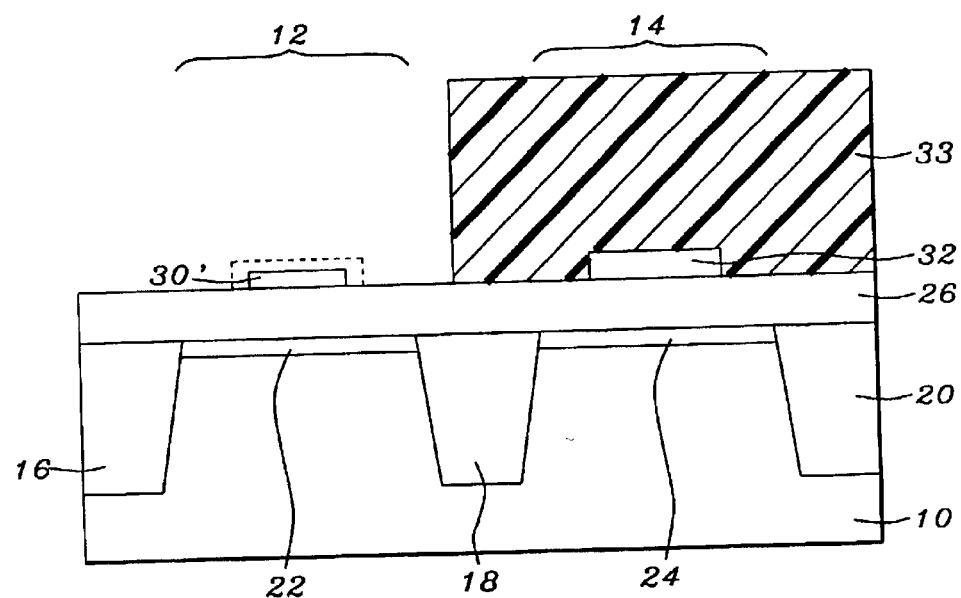

Trimming of Exposed Hard Mask Layer Portion 30—FIG. 6

As shown in FIG. 6, the exposed hard mask layer portion 30 determined to eventually form a gate electrode having the smallest channel length is subjected to a trimming process which erodes the exposed hard mask layer portion 30 to a first trimmed hard mask layer portion 30' having at least a narrower width than the hard mask layer portion 30. The trimming process is preferably the same process used to pattern the hard mask layer 28 to form the hard mask layer portions 30, 32.

Figure 7:
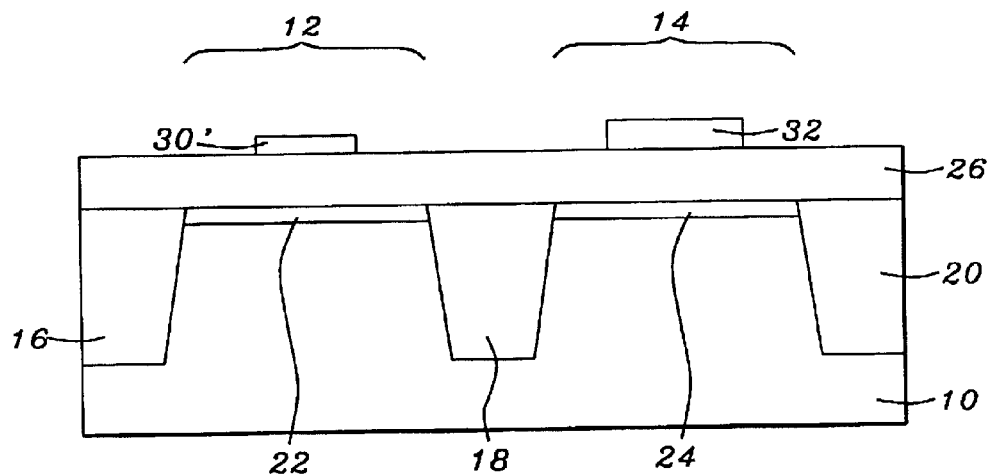

Removal of the Patterned Second Masking Layer Portion 33—FIG. 7

As shown in FIG. 7, the patterned second masking layer portion 33 is removed and the structure is cleaned as necessary.

It is noted that if there are three or more active areas 13, 14 with respective hard mask layer portions 30, 32, and it is desired to have three or more different CD bias devices/channel lengths, a patterned third masking layer portion(s) is/are formed over at least the active area within which the larger CD bias devices/channel lengths are to be formed leaving the active areas having the smaller CD bias devices/channel lengths exposed so that an additional trimming process is performed on the exposed first trimmed hard mask layer portion 30' and the now exposed hard mask layer portion to form a first and second trimmed hard mask layer portion 30" having even a smaller width and a second trimmed hard mask layer portion have a width smaller than the patterned third masking layer portion(s) covered hard mask layer portion(s). The patterned third masking layer portion(s) is/are removed and this may be repeated again using a patterned fourth masking layer portion(s), a patterned fifth masking layer portion(s), etc. until the desired range of CD bias devices/channel lengths may be subsequently formed.

As one skilled in the art would recognize, first trimming mask and second, third, etc. trimming mask(s) covering different active regions to achieve different etch biases is allowed within the teachings of the present invention. That is, etch biases mean forming respective hard mask layer portions (30, 32, e.g.) having differing widths within respective different active regions to thus form corresponding gate electrode layer portions (34, 36, e.g.) as described below.

Figure 8:
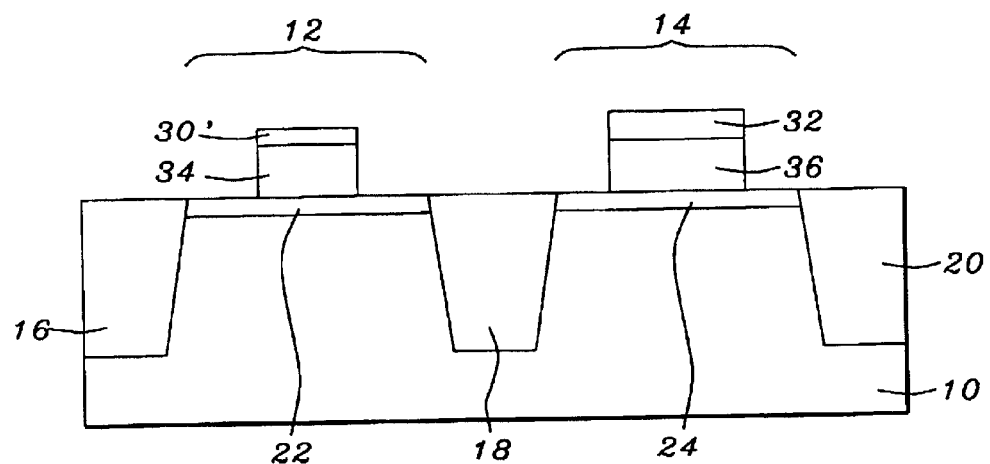

Patterning of Gate Electrode Layer 26—FIG. 8

As shown in FIG. 8, the gate electrode layer 26 is patterned using the first trimmed hard mask layer portion 30' (or any first and second trimmed hard mask layer portion 30", second trimmed hard mask layer portion, etc.) and the (untrimmed, or least trimmed) hard mask layer portion 32 to form a first gate electrode layer portion 34 having the smallest width (that may be partially trimmed many times) (or a first gate electrode layer portion 32 having the smallest width, second gate electrode layer portion having a width wider than the smallest width and narrower than the largest width, etc.) and a last gate electrode layer portion 36 generally having the largest width.

The width of the smallest width trimmed hard mask layer portion 34 may be as narrow as from about 100 to 95,000 Å.

Figure 9:
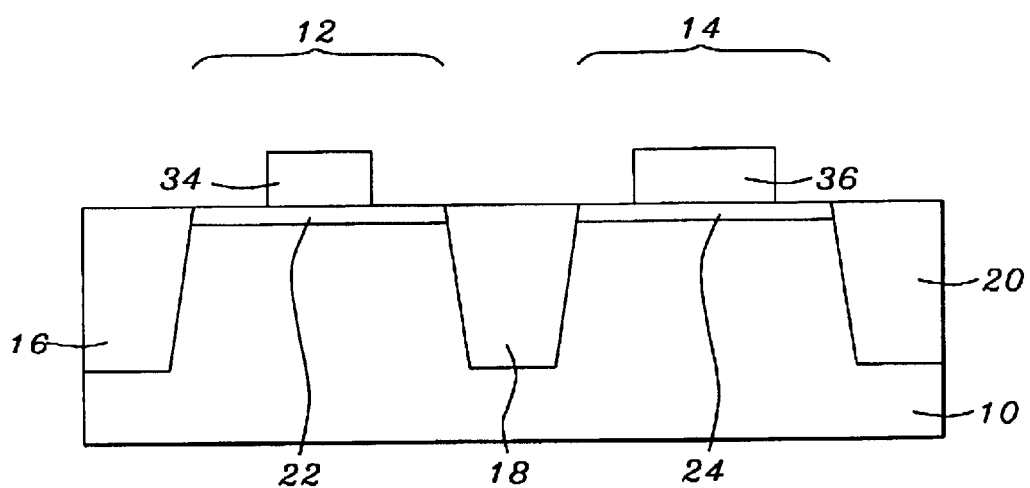

Removal of the First Trimmed Hard Mask Layer Portion 30' (and any Intermediate Trimmed Hard Mask Layer Portion (s)) and the Untrimmed Hard Mask Layer Portion 32—FIG. 9

As shown in FIG. 9, the first trimmed hard mask layer portion 30' (or any first and second trimmed hard mask layer portion 30", second trimmed hard mask layer portion, etc.) and the (untrimmed, or the least trimmed) hard mask layer portion 32 are removed from over the respective first gate electrode layer portion 34 having the smallest width (or a first gate electrode layer portion 32 having the smallest width, second gate electrode layer portion having a width wider than the smallest width and narrower than the largest width, etc.) and a last gate electrode layer portion 36 generally having the largest width and the structure is cleaned as necessary.

Further processing may then proceed to form semiconductor devices using the respective first gate electrode layer portion 34 having the smallest width (or a first gate electrode layer portion 32 having the smallest width, second gate electrode layer portion having a width wider than the smallest width and narrower than the largest width, etc.) and a last gate electrode layer portion 36 generally having the largest width.

Advantages of the Present Invention

The advantages of one or more embodiments of the present invention include:

1. different poly CD bias within a wafer for SOC application is achieved without any logic operation;
2. different poly CD bias within a wafer for SOC application is achieved without a relaxation of the design rule;
3. a high performance device a and low leakage device exist simultaneously within a wafer for SOC application without any logic operation and without relaxing the design rule is achieved; and
4. minimum polysilicon trimming in memory cell array is used to achieve minimum cell size without endcap window issue.

Advantages 2 and 4 above are due to wider poly (like low leakage and SRAM cell) having separate etch bias with the smallest poly (core device). Thus, the least trimming bias is allowed in the wider poly device.

While particular embodiments of the present invention have been illustrated and described, it is not intended to limit the invention, except as defined by the following claims.

We claim:

1. A method of forming gate electrode layer portions having differing widths, comprising the steps of:
    a) providing a structure having two or more active areas;
    b) forming a gate electrode layer over the structure;
    c) forming a hard mask layer over the gate electrode layer;
    d) patterning the hard mask layer within the two or more active areas to form two or more respective hard mask layer portions within the two or more active areas; the two or more respective hard mask layer portions having a first width; e) selectively trimming at least one of the two or more respective hard mask layer portions to reduce the width of the trimmed at least one of the two or more respective hard mask layer portions to a second width; and f) patterning the gate electrode layer.
to form respective two or more gate electrode layer portions wherein at least one of the two or more gate electrode layer portions has a second width less than at least one other of the two or more gate electrode layer portions.

2. The method of claim 1, including the step of:
    masking one or more of the two or more respective hard mask layer portions leaving at least one of the two or more respective hard mask layer portions unmasked;
    after step d) and before step e); and the step of:
    unmasking the masked one or more of the two or more respective hard mask layer portions;
    after step e) and before step f).

3. The method of claim 1, wherein the gate electrode layer is patterned using:
    the unmasked one or more of the two or more respective hard mask layer portions; and
    the trimmed at least one of the two or more respective hard mask layer portions as masks;
to form respective two or more gate electrode layer portions wherein at least one of the two or more gate electrode layer portions has a second width less than at least one other of the two or more gate electrode layer portions.

4. The method of claim 1, wherein the gate electrode layer is patterned using:

the unmasked one or more of the two or more respective hard mask layer portions; and the trimmed at least one of the two or more respective hard mask layer portions as masks;

to form respective two or more gate electrode layer portions wherein at least one of the two or more gate electrode layer portions has a second width of from about 100 to 95,000 Å that is less than at least one other of the two or more gate electrode layer portions.

5. The method of claim 1, wherein the gate electrode layer is patterned using:

the unmasked one or more of the two or more respective hard mask layer portions; and the trimmed at least one of the two or more respective hard mask layer portions as masks;

to form respective two or more gate electrode layer portions wherein at least one of the two or more gate electrode layer portions has a second width less than at least one other of the two or more gate electrode layer portions; and including the step of:

i) forming respective devices incorporating the two or more gate electrode layer portions whereby the respective device(s) incorporating the at least one of the two or more gate electrode layer portions having the second width has a channel length less than the respective device(s) incorporating the at least one other two or more gate electrode layer portions having the first width.

6. The method of claim 1, wherein the structure is a silicon substrate or a germanium substrate.

7. The method of claim 1, wherein the structure is a silicon substrate.

8. The method of claim 1, wherein the two or more active areas are separated by respective isolation structures.

9. The method of claim 1, wherein two or more active areas are separated by respective shallow trench isolation structures or local-oxidation-of-silicon.

10. The method of claim 1, wherein the gate electrode layer is comprised of polysilicon; and the hard mask layer is comprised of silicon nitride, silicon oxynitride or silicon oxide.

11. The method of claim 1, wherein the gate electrode layer has a thickness of from about 500 to 3000 Å; and the hard mask layer has a thickness of from about 50 to 1000 Å.

12. The method of claim 1, wherein the hard mask layer within the two or more active areas is patterned using a patterned masking layer.

13. The method of claim 1, wherein the hard mask layer within the two or more active areas is patterned using a patterned photoresist layer.

14. The method of claim 1, wherein the unmasked at least one of the two or more respective hard mask layer portions is trimmed using an etch process.

15. The method of claim 1, wherein respective gate dielectric layer portions are formed upon the structure within the two or more active areas.

16. The method of claim 1, wherein step f) is repeated at least one additional iteration before the step g) patterning of the gate electrode layer whereby:

the first partially trimmed hard mask layer portion is trimmed a second time to a third width that is less than the second width;

at least one of the untrimmed hard mask layer portions is trimmed to the fourth width that is less than the first width and greater than the third width; and at least another one of the untrimmed, or least trimmed, hard mask layer portions is either not trimmed or is least trimmed and maintains the first width or a width proximate the first width.

17. A method of forming gate electrode layer portions having differing widths, comprising the steps of:

a) providing a structure having two or more active areas;

b) forming a gate electrode layer over the structure;

c) forming a hard mask layer over the gate electrode layer;

d) patterning the hard mask layer within the two or more active areas to form two or more respective hard mask layer portions within the two or more active areas; the two or more respective hard mask layer portions having a first width;

e) masking one or more of the two or more respective hard mask layer portions leaving at least one of the two or more respective hard mask layer portions unmasked;

f) trimming the unmasked at least one of the two or more respective hard mask layer portions to reduce the width of the trimmed unmasked at least one of the two or more respective hard mask layer portions to a second width;

g) unmasking the masked one or more of the two or more respective hard mask layer portions; and h) patterning the gate electrode layer using:

the unmasked one or more of the two or more respective hard mask layer portions; and the trimmed at least one of the two or more respective hard mask layer portions as masks;

to form respective two or more gate electrode layer portions wherein at least one of the two or more gate electrode layer portions has a second width less than at least one other of the two or more gate electrode layer portions.

18. The method of claim 17, wherein the structure is a silicon substrate or a germanium substrate.

19. The method of claim 17, wherein the structure is a silicon substrate.

20. The method of claim 17, wherein the two or more active areas are separated by respective isolation structures.

21. The method of claim 17, wherein two or more active areas are separated by respective shallow trench isolation structures or local-oxidation-of-silicon.

22. The method of claim 17, wherein the gate electrode layer is comprised of polysilicon; and the hard mask layer is comprised of silicon nitride, silicon oxynitride or silicon oxide.

23. The method of claim 17, wherein the gate electrode layer has a thickness of from about 500 to 3000 Å; and the hard mask layer has a thickness of from about 50 to 1000 Å.

24. The method of claim 17, wherein the hard mask layer within the two or more active areas is patterned using a patterned masking layer.

25. The method of claim 17, wherein the hard mask layer within the two or more active areas is patterned using a patterned photoresist layer.

26. The method of claim 17, wherein the unmasked at least one of the two or more respective hard mask layer portions is trimmed using an etch process.

27. The method of claim 17, wherein the second width is from about 100 to 95,000 Å.

28. The method of claim 17, wherein respective gate dielectric layer portions are formed upon the structure within the two or more active areas.

29. The method of claim 17, wherein steps e) to g) are repeated at least one additional iteration before the step h) patterning of the gate electrode layer whereby:

the first partial trimmed hard mask layer portion is trimmed a second time to a third width that is less than the second width;

at least one of the untrimmed hard mask layer portions is trimmed to the fourth width that is less than the first width and greater than the third width; and at least another one of the untrimmed, or least trimmed, hard mask layer portions is either not trimmed or is least trimmed and maintains the first width or a width proximate the first width.

30. The method of claim 17, including the step of:
i) forming respective devices incorporating the two or more gate electrode layer portions whereby the respective device(s) incorporating the at least one of the two or more gate electrode layer portions having the second width has a channel length less than the respective device(s) incorporating the at least one other two or more gate electrode layer portions having the first width.

31. A method of forming gate electrode layer portions having differing widths, comprising the steps of:
a) providing a structure having two or more active areas;
b) forming a gate electrode layer over the structure;
c) forming a hard mask layer over the gate electrode layer;
d) patterning the hard mask layer within the two or more active areas using a patterned masking layer to form two or more respective hard mask layer portions within the two or more active areas; the two or more respective hard mask layer portions having a first width;
e) masking one or more of the two or more respective hard mask layer portions leaving at least one of the two or more respective hard mask layer portions unmasked;
f) trimming the unmasked at least one of the two or more respective hard mask layer portions to reduce the width of the trimmed unmasked at least one of the two or more respective hard mask layer portions to a second width;
g) unmasking the masked one or more of the two or more respective hard mask layer portions; and
h) patterning the gate electrode layer using:
the unmasked one or more of the two or more respective hard mask layer portions; and
the trimmed at least one of the two or more respective hard mask layer portions as masks;
to form respective two or more gate electrode layer portions wherein at least one of the two or more gate electrode layer portions has a second width less than at least one other of the two or more gate electrode layer portions.

32. The method of claim 31, wherein the structure is a silicon substrate or a germanium substrate.

33. The method of claim 31, wherein the structure is a silicon substrate.

34. The method of claim 31, wherein the two or more active areas are separated by respective isolation structures.

35. The method of claim 31, wherein two or more active areas are separated by respective shallow trench isolation structures or local-oxidation-of-silicon.

36. The method of claim 31, wherein the gate electrode layer is comprised of polysilicon; and the hard mask layer is comprised of silicon nitride, silicon oxynitride or silicon oxide.

37. The method of claim 31, wherein the gate electrode layer has a thickness of from about 500 to 3000 Å; and the hard mask layer has a thickness of from about 50 to 1000 Å.

38. The method of claim 31, wherein the patterned masking layer used to pattern the hard mask layer within the two or more active areas is a patterned photoresist layer.

39. The method of claim 31, wherein the unmasked at least one of the two or more respective hard mask layer portions is trimmed using an etch process.

40. The method of claim 31, wherein the second width is from about 100 to 95,000 Å.

41. The method of claim 31, wherein respective gate dielectric layer portions are formed upon the structure within the two or more active areas.

42. The method of claim 31, wherein steps e) to g) are repeated at least one additional iteration before the step h) patterning of the gate electrode layer whereby:
the first partial trimmed hard mask layer portion is trimmed a second time to a third width that is less than the second width;
at least one of the untrimmed hard mask layer portions is trimmed to the fourth width that is less than the first width and greater than the third width; and
at least another one of the untrimmed, or least trimmed, hard mask layer portions is either not trimmed or is least trimmed and maintains the first width or a width proximate the first width.

43. The method of claim 31, including the step of:
i) forming respective devices incorporating the two or more gate electrode layer portions whereby the respective device(s) incorporating the at least one of the two or more gate electrode layer portions having the second width has a channel length less than the respective device(s) incorporating the at least one other two or more gate electrode layer portions having the first width.

* * * * *